(12) United States Patent
Liu et al.

(10) Patent No.: US 7,563,675 B2
(45) Date of Patent: Jul. 21, 2009

(54) LADDER POLY ETCHING BACK PROCESS FOR WORD LINE POLY PLANARIZATION

(75) Inventors: Shih-Chang Liu, Alian Township (TW); Yuan-Hung Liu, Hsin-Chu (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 180 days.

(21) Appl. No.: 11/782,491

(22) Filed: Jul. 24, 2007

(65) Prior Publication Data

US 2009/0029547 A1    Jan. 29, 2009

(51) Int. Cl.
*H01L 21/8247* (2006.01)
(52) U.S. Cl. .................. 438/257; 257/E21.179
(58) Field of Classification Search ......... 438/257–267; 257/E21.179
See application file for complete search history.

(56) References Cited

U.S. PATENT DOCUMENTS

| | | | |
|---|---|---|---|
| 6,103,606 A | 8/2000 | Wu et al. | |
| 6,211,061 B1 | 4/2001 | Chen et al. | |
| 6,309,955 B1 | 10/2001 | Subramanian et al. | |
| 6,869,837 B1 | 3/2005 | Liu et al. | |
| 6,943,119 B2 | 9/2005 | Ko | |
| 7,067,866 B2 | 6/2006 | Shi | |
| 7,087,956 B2 | 8/2006 | Umebayashi | |
| 7,105,452 B2 | 9/2006 | Sreenivasan | |
| 7,153,755 B2 | 12/2006 | Liu et al. | |
| 7,172,908 B2 | 2/2007 | Liu et al. | |
| 2004/0118809 A1 | 6/2004 | Chou et al. | |
| 2004/0121545 A1 | 6/2004 | Chen et al. | |
| 2006/0001081 A1 | 1/2006 | Sasago et al. | |
| 2006/0076598 A1 | 4/2006 | Higashi et al. | |
| 2007/0066004 A1 | 3/2007 | Nakagawa et al. | |
| 2007/0155066 A1* | 7/2007 | Liu et al. ................ | 438/149 |
| 2008/0166883 A1* | 7/2008 | Liu et al. ................ | 438/761 |

* cited by examiner

*Primary Examiner*—Richard A. Booth
(74) *Attorney, Agent, or Firm*—Duane Morris LLP (57) ABSTRACT

A method is disclosed for etching a polysilicon material in a manner that prevents formation of an abnormal polysilicon profile. The method includes providing a substrate with a word line and depositing a polysilicon layer over said substrate and word line. An organic bottom antireflective coating (BARC) layer is then deposited over said polysilicon layer. A ladder etch is performed to remove the BARC layer and a portion of the polysilicon layer. The ladder etch consists of a series of etch cycles, with each cycle including a breakthrough etch and a soft landing etch. The breakthrough and soft landing etches are performed using different etchant gases, and at different source and bias powers, pressures, gas flow rates, and periods of time. The ladder etch results in a smooth polysilicon surface without abrupt steps.

20 Claims, 9 Drawing Sheets

Fig. 9

LADDER POLY ETCHING BACK PROCESS FOR WORD LINE POLY PLANARIZATION

FIELD OF THE INVENTION

The present invention relates generally to a etching method for use as part of word line poly planarization, and more particularly to a ladder etching method for use as part of embedded flash cell word line planarization.

BACKGROUND OF THE INVENTION

Flash memory is non-volatile computer memory that can be electrically erased and reprogrammed. It is a technology that has typically been used in memory cards, and USB flash drives (thumb drives, handy drive), which are used for general storage and transfer of data between computers and other Digital products. Flash memory costs far less than EEPROM and therefore has become the dominant technology wherever a significant amount of non-volatile, solid-state storage is needed. Examples of applications include laptop computers, digital audio players, digital cameras and mobile phones. It has also gained popularity in the game console market, where it is often used instead of EEPROMs or battery-powered static RAM (SRAM) for game save data.

Embedded flash technology consists of flash memory built directly onto a processor. For example, a graphics chip may have embedded memory instead of using separate memory chips. With the continuing growth of consumer and mobile electronics markets, chip makers are racing to make ever smaller features, which increasingly require more advanced embedded flash technologies as they begin to include more functionality.

In addition to consumer and mobile electronics markets, the use of embedded flash technology is also becoming more prevalent in high density applications that require low power such as microcontroller cores, high-speed ASICs (application-specific integrated circuits) and multimedia ICs (integrated circuits).

Figure 2:
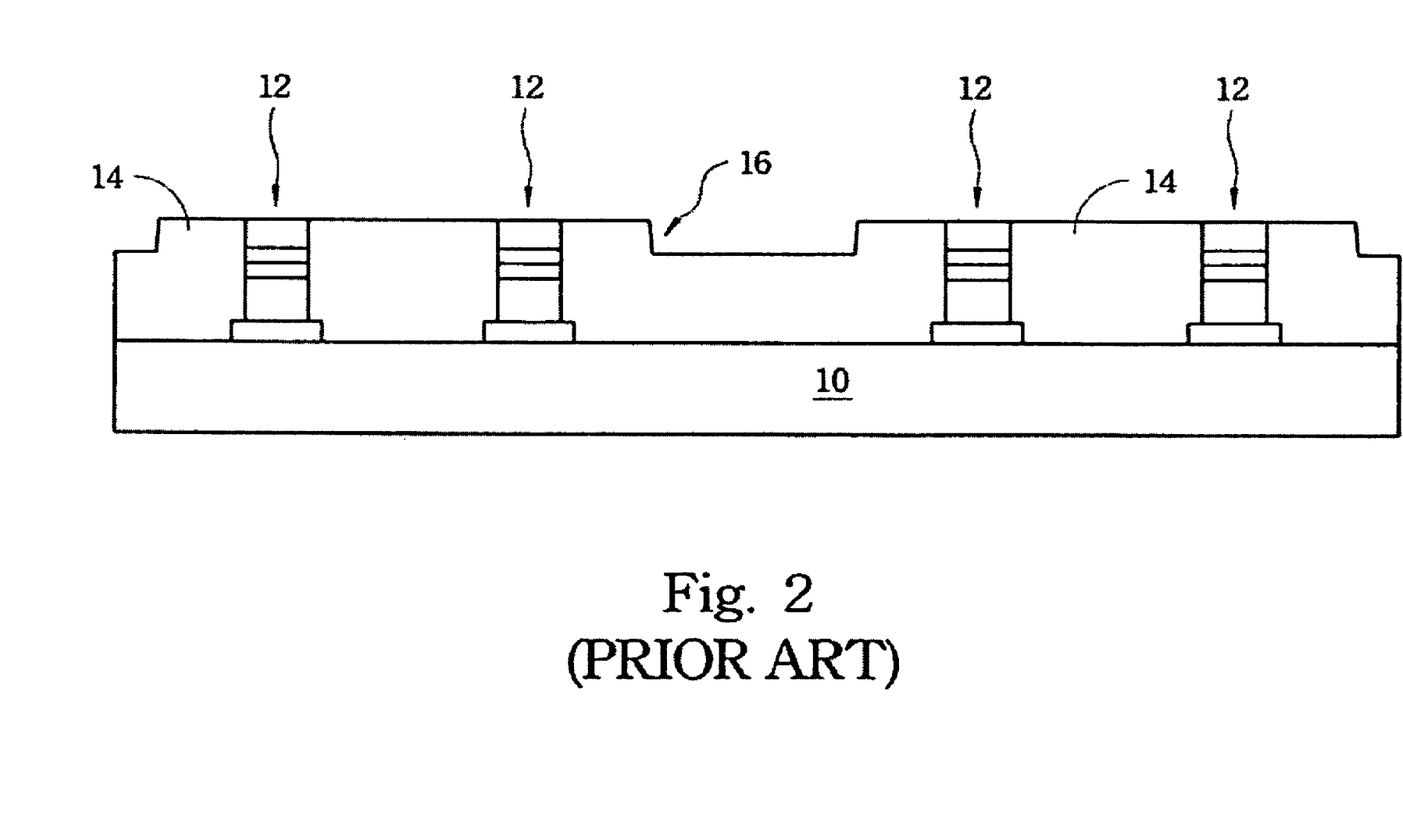

The production of embedded flash chips is not without difficulty. For example, due to the high topography of the typical flash cell structure, however, it is a challenge to perform word line etching without damaging the individual flash cells. To avoid such damage, word line polysilicon planarization may be performed using a chemical-mechanical polishing (CMP). A problem with using such CMP process is that an 800 Angstrom step height (see FIG. 2) may still exist after poly-CMP. This step height can cause an abnormal SiON thickness (see FIG. 3) that will induce an abnormal polysilicon profile during subsequent poly etching. An abnormal polysilicon profile can result in undesirable variations in etched channel length as well as reduced control over etched channel depth.

Thus, it would be desirable to provide a planarization process that eliminates undesirable step heights associated with prior techniques, thereby minimizing or eliminating subsequent abnormal SiON thicknesses that can induce abnormal polysilicon profiles.

SUMMARY OF THE INVENTION

To solve the aforementioned problem, a ladder etching process is disclosed for reducing step height and to obtain a smooth poly surface, that will reduce the risk of word line poly abnormalities.

A method of word line etching is disclosed, comprising the steps of: (a) patterning a word line; (b) depositing a layer of polysilicon over said word line; (c) depositing a layer of bottom antireflective coating (BARC) material over said layer of polysilicon; (d) etching said BARC layer and said polysilicon layer using a ladder etch, said ladder etch removing the BARC layer and a portion of said polysilicon layer; (f) depositing a dielectric layer of a top surface of the etched polysilicon layer; and (g) applying a mask layer over said dielectric layer and etching at least one feature into said polysilicon layer; wherein said ladder etch comprises a series of breakthrough etch steps and soft landing etch steps.

An etching method is disclosed, comprising the steps of: (a) providing a substrate with a plurality of word lines formed thereon; (b) depositing a layer of polysilicon over said plurality of word lines; (c) depositing a layer of organic spin-on material over said layer of polysilicon; (d) etching said organic spin-on material layer and said polysilicon layer using a ladder etch, said ladder etch removing the organic spin-on material layer and a thickness of said polysilicon layer so that said polysilicon layer does not overlie a top surface of each of the plurality of word lines; (f) depositing a dielectric layer of a top surface of the etched polysilicon layer; and (g) applying a mask layer over said dielectric layer and etching at least one feature into said polysilicon layer; wherein said ladder etch comprises a series of breakthrough etch steps and soft landing etch steps.

An etching method is disclosed, comprising the steps of: (a) providing a flash cell on a substrate, the flash cell comprising a word line; (b) depositing a layer of polysilicon over said word line; (c) depositing a dielectric layer over an area peripheral to said flash cell; (d) depositing an organic BARC coating over said polysilicon layer; (e) performing a ladder etch of said BARC coating, said dielectric layer, and said polysilicon layer to a level below a top surface of said word line; (f) depositing a dielectric layer over said etched polysilicon layer and said word line; (g) applying a photo mask over said dielectric layer; and (h) etching the dielectric layer and the polysilicon layer to create an etched feature; wherein said ladder etch comprises a series of breakthrough etch steps and soft landing etch steps.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts, and further wherein.

DETAILED DESCRIPTION

Figure 1:
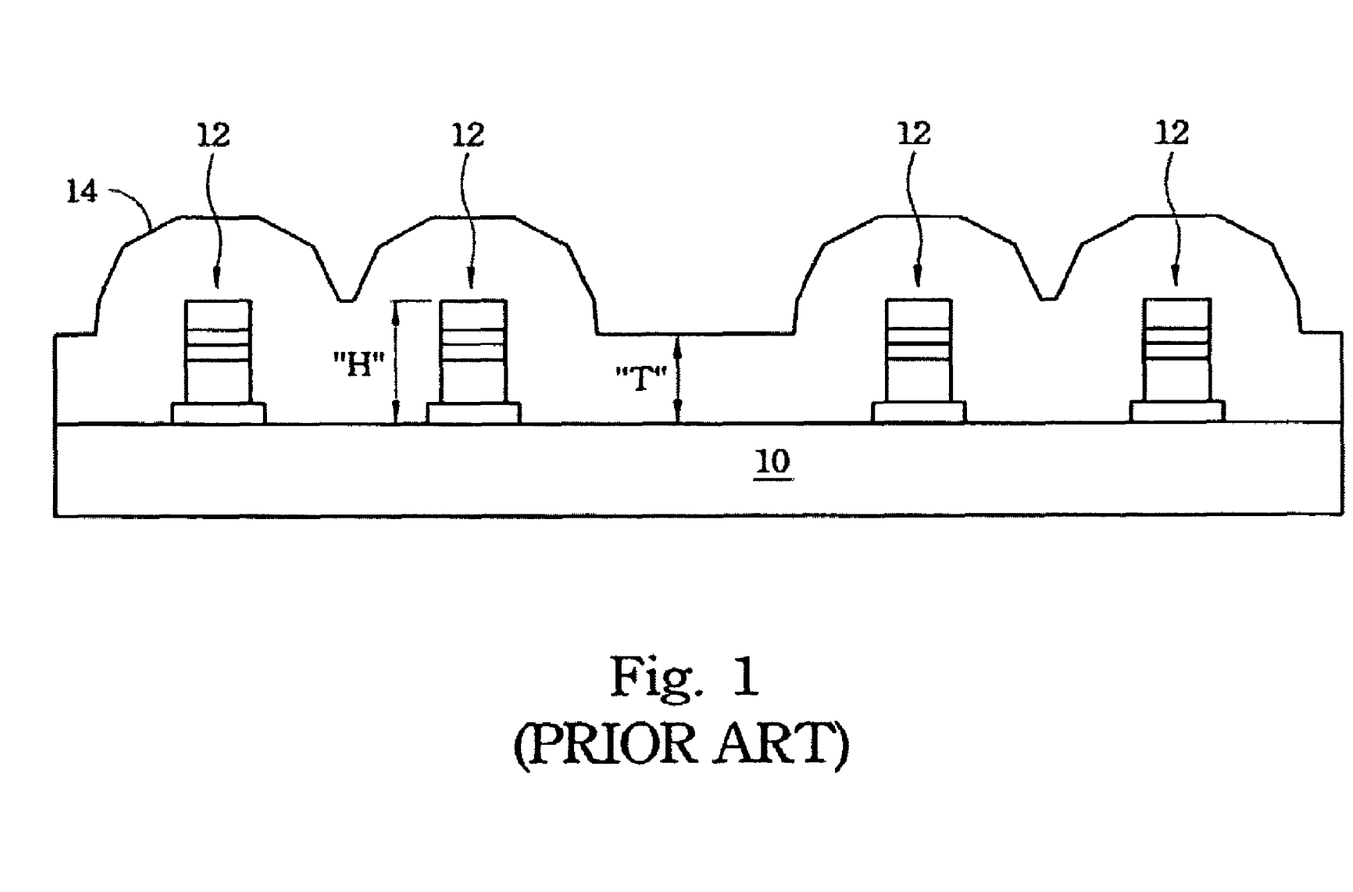
FIGS. 1 through 4 show cross section views of a conventional process for poly word line planarization.
Figure 3:
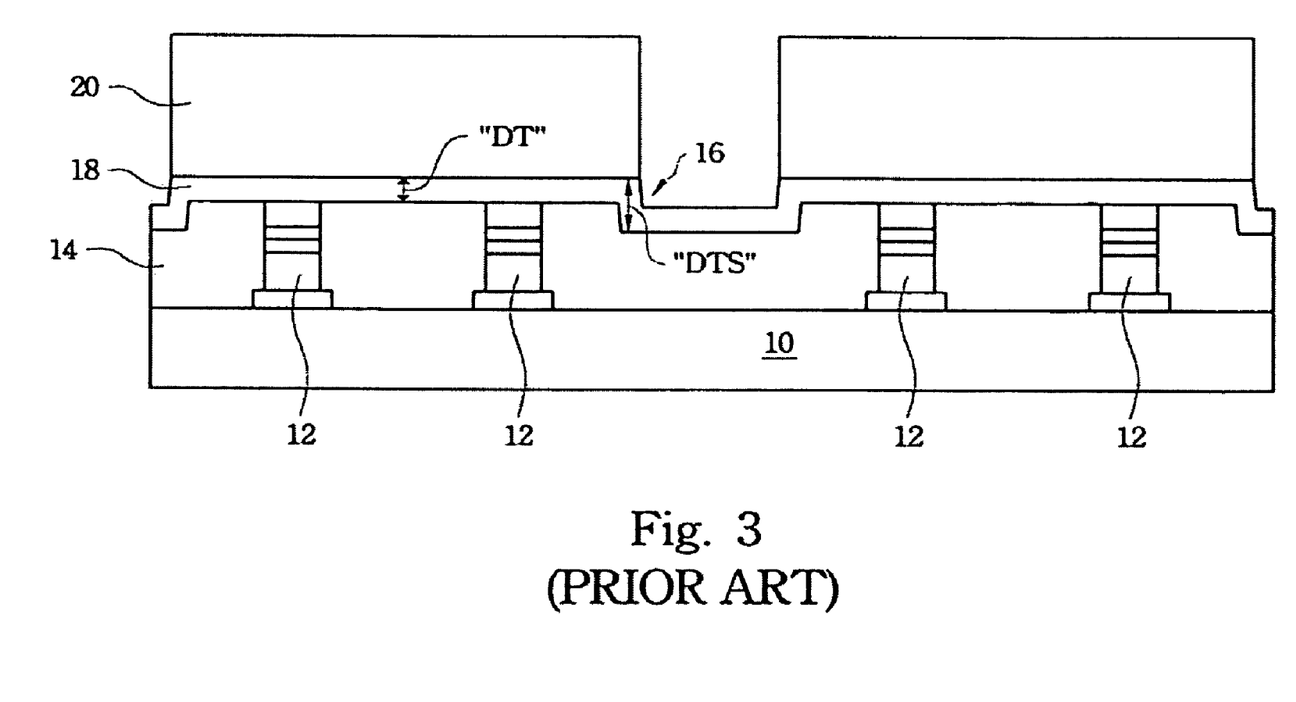
Figure 4:
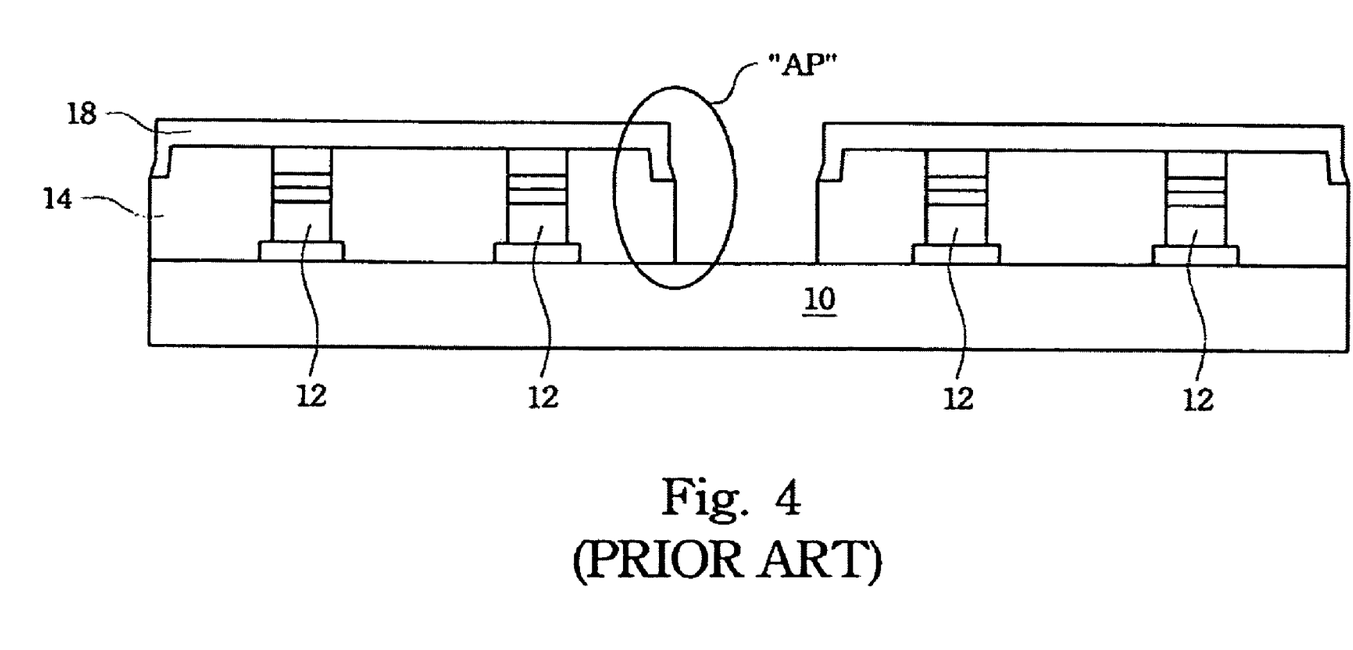

According to an embodiment of the present invention, disclosed herein is a method for ladder etching to reduce a poly profile step height and to obtain a smooth poly surface, thereby reducing the risk of word line poly abnormalities Referring to FIG. 1, a substrate 10 is provided upon which a plurality of word lines 12 are fabricated. A polysilicon layer 14 is then formed over substrate and word lines using known methods, such as chemical vapor deposition (CVD) or the like. A planarization process, such as chemical-mechanical planarazation (CMP) is then performed to remove the portion of the polysilicon layer 14 residing directly above the word lines 12, with the resulting structure shown in FIG. 2. As can be seen, where the total thickness "T" of the polysilicon layer is less than the height "H" of the word lines, a step region 16 is formed in the polysilicon layer during CMP. In some cases, where the polysilicon layer is deposited to a thickness "T" of about 1,500 Angstroms (Å), this step height "H" can be about 800 Å. As shown in FIG. 3, during subsequent deposition of dielectric 18, this step height "H" can cause an abnormally thick region "TR" of dielectric 18 to be formed in the step region 16. In one example, where the dielectric 18 is deposited to a thickness "DT" of about 660 Å over the word lines 12, the thickness "DTS" of the dielectric 18 in the step region 16 can be nearly twice that thickness (e.g., 1300 Å). When a mask layer 20 is applied and etching performed, this thicker layer of dielectric 18 in the step region 16 causes an abnormal polysilicon profile "AP" to be formed.

Figure 5:
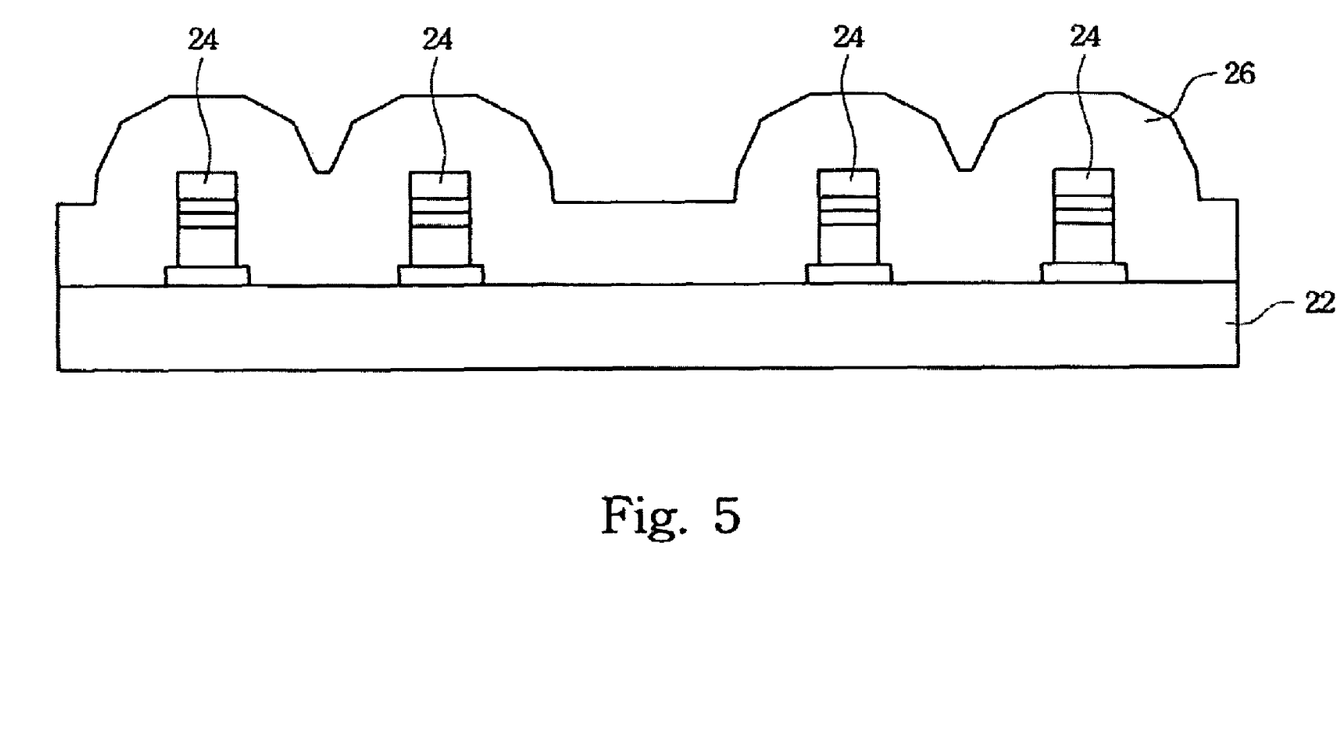
FIG. 5 shows a cross section view of a plurality of word lines formed on a substrate and a polysilicon layer formed thereover.
Figure 6:
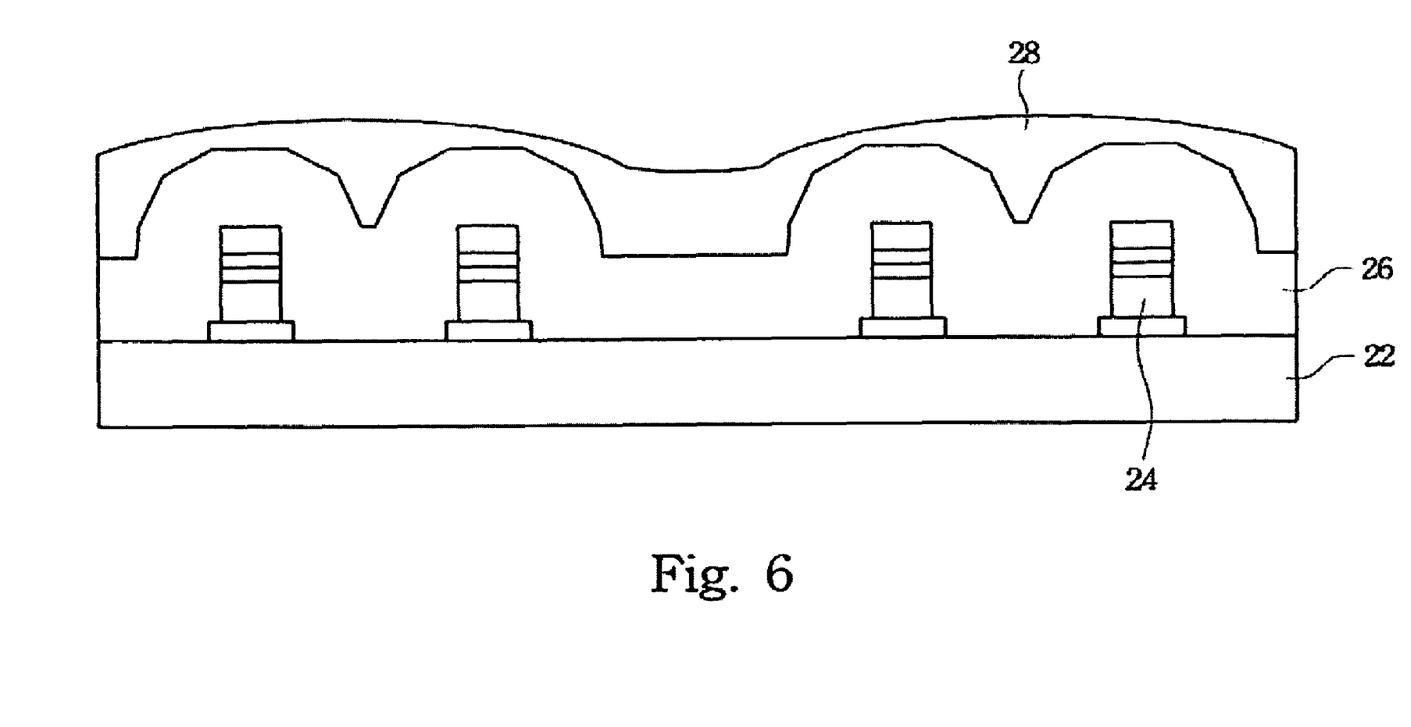
FIG. 6 shows the structure of FIG. 5 subsequent to deposition of a BARC layer over the polysilicon layer.

Now referring to FIGS. 5-9, the inventive process will be described. FIG. 5 shows a substrate 22 upon which are formed a plurality of floating gate and control gate pairs 24. The control gate (i.e., the uppermost layer) may comprise a continuous polysilicon strip that forms a word line for the memory device. For convenience, item 24 will be described hereinafter as the "word line." A polysilicon layer 26 is formed over the substrate and gates/wordlines 24 using known methods, such as chemical vapor deposition (CVD) or the like. This polysilicon layer 26 may have a thickness of from about 1000 Å to about 3000 Å, and preferably about 1500 Å, while thickness of the gate layer 24 may be from about 3000 Å to 3600 Å. An organic bottom antireflective coating (BARC) layer 28 may then be provided over the polysilicon layer. It will be appreciated that other easily removable materials may be used in lieu of BARC, such as a spin-on organic material (photoresist). The BARC layer 28 may have a thickness of up to about 1600 Å. The BARC layer 28 may be formed using appropriate spin-on techniques.

Figure 7:
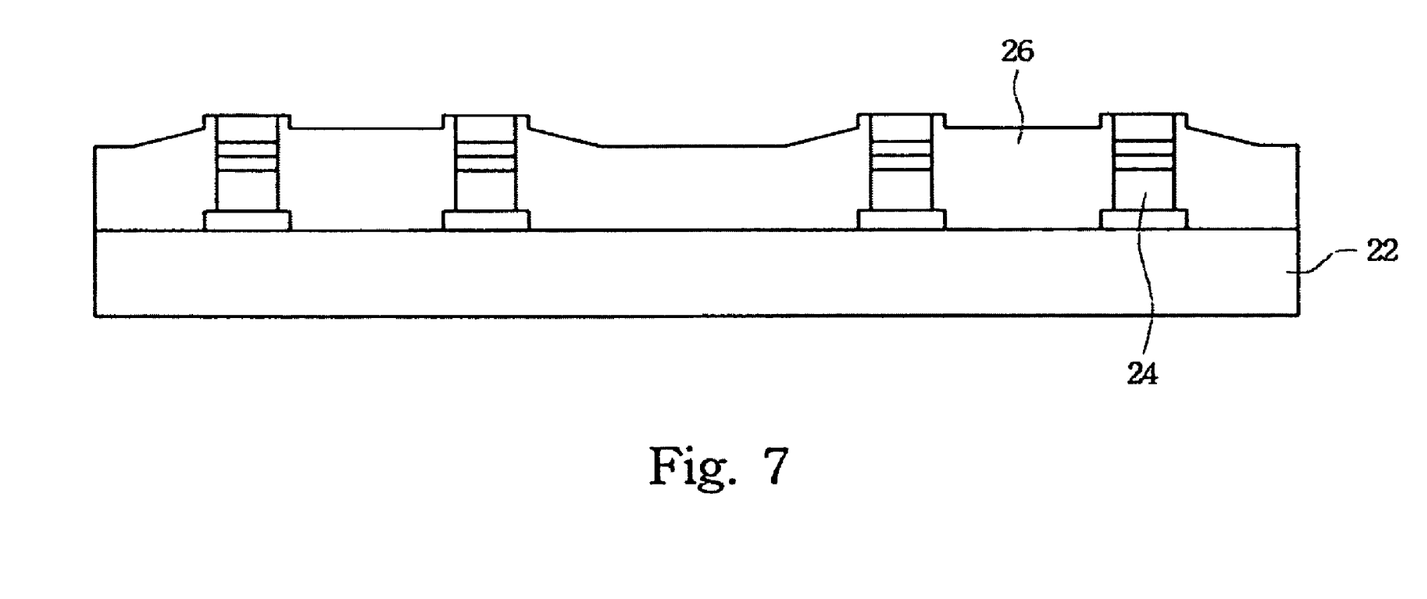
FIG. 7 shows the structure of FIG. 6 subsequent to an etch back of the BARC layer and a portion of the polysilicon layer.

The BARC layer 28 and a portion of the polysilicon layer 26 (to a point below the top of the word lines 24) may then be removed using a ladder etching process to achieve the profile shown in FIG. 7. The ladder etching process may be performed follows:

Etch step 1 may comprise a Breakthrough Etch (BT1) using $CF_4$ as the etchant gas. BT1 may be performed at a pressure of about 4 milli-Torr (mT), a source power of from about 100 Watts (W) to about 500 W, preferably about 300 Watts (W), a bias power of from about 30 W to 150 W, preferably about 45 W, an etchant gas flowrate of from about 30 standard cubic centimeters per minute (sccm) to about 150 sccm, preferably about 50 sccm, and for a period of about 30 seconds.

Etch step 2 may be a Soft Landing Etch (SL1) using a combination of HBr and $HeO_2$ as etchant gases. SL1 may be performed at a pressure of about 5 mT, source power of from about 100 W to about 500 W, preferably about 350 W, bias power of from about 20 W to about 100 W, and preferably about 36 W, HBr flowrate of from about 100 sccm to about 300 sccm, preferably about 200 sccm, $HeO_2$ flowrate of from about 10 sccm to about 30 sccm, preferably about 23 sccm, and for a period of about 15 seconds.

Etch step 3 may comprise a second Breakthrough Etch (BT2) using a combination of HBr and $HeO_2$ as etchant gases. BT2 may be performed at a pressure of about 4 mT, source power of from about 100 W to about 500 W, preferably about 350 W, bias power of from about 30 W to about 150 W, preferably about 36 W, HBr flowrate of from about 100 sccm to about 300 sccm, preferably about 200 sccm, $HeO_2$ flowrate of from about 10 sccm to about 30 sccm, preferably about 23 sccm, and for a period of about 13 seconds.

Etch step 4 may comprise a second Soft Landing Etch (SL2) using a combination of HBr and $HeO_2$ as etchant gases. SL2 may be performed at a pressure of about 5 mT, source power of from about 100 W to about 500 W, preferably about 350 W, bias power of from about 20 W to about 100 W, preferably about 36 W, HBr flowrate of from about 100 sccm to about 300 sccm, preferably about 200 sccm, $HeO_2$ flowrate of from about 10 sccm to about 30 sccm, preferably about 23 sccm, and for a period of about 15 seconds.

Etch step 5 may comprise a third Breakthrough Etch (BT3) using 50 $CF_4$ as the etchant gas. BT3 may be performed at a pressure of about 4 mT, source power of from about 100 W to about 500 W, preferably about 300 W, bias power of from about 30 W to about 150 W, preferably about 45 W, $CF_4$ flowrate of from about 30 sccm to about 150 sccm, preferably about 50 sccm, and for a period of about 13 seconds.

Etch step 6 may comprise a third Soft Landing Etch (SL3) using a combination of HBr and $HeO_2$ as etchant gases. SL3 may be performed at a pressure of about 5 mT, source power of from about 100 W to about 500 W, preferably about 350 W, bias power of from about 20 W to about 100 W, preferably about 36 W, HBr flowrate of from about 100 sccm to about 300 sccm, preferably about 200 sccm, $HeO_2$ flowrate of from about 10 sccm to about 30 sccm, preferably about 23 sccm, and for a period of about 15 seconds.

Etch step 7 may comprise a fourth Breakthrough Etch (BT4) using $CF_4$ as etchant gas. BT4 may be performed at a pressure of about 4 mT, source power of from about 100 W to about 500 W, preferably about 300 W, bias power of from about 30 W to about 150 W, preferably about 45 W, $CF_4$ flowrate of from about 30 sccm to about 150 sccm, preferably about 50 sccm, and for a period of about 13 seconds.

Etch step 8 may comprise a fourth Soft Landing Etch (SL4) using a combination of HBr and $HeO_2$ as etchant gases. SL4 may be performed at a pressure of about 5 mT, source power of from about 100 W to about 500 W, preferably about 350 W, bias power of from about 20 W to about 100 W, preferably about 36 W, HBr flowrate of from about 100 sccm to about 300 sccm, preferably about 200 sccm, $HeO_2$ flowrate of from about 10 sccm to about 30 sccm, preferably about 23 sccm, and for a period of about 15 seconds.

Etch step 9 may comprise a fifth Breakthrough Etch (BT5) using $CF_4$ as etchant gas. BT5 may be performed at a pressure of about 4 mT, source power of from about 100 W to about 500 W, preferably about 300 W, bias power of from about 30 W to about 150 W, preferably about 45 W, $CF_4$ flowrate of from about 30 sccm to about 150 sccm, preferably about 50 sccm, and for a period of about 13 seconds.

Etch step 10 may comprise a fifth Soft Landing Etch (SL5) using a combination of HBr and $HeO_2$ as etchant gases. SL5 may be performed at a pressure of about 5 mT, source power of from about 100 W to about 500 W, preferably about 300 W, bias power of from about 20 W to about 100 W, preferably about 36 W, HBr flowrate of from about 100 sccm to about 300 sccm, preferably about 200 sccm, $HeO_2$ flowrate of from about 10 sccm to about 30 sccm, preferably about 23 sccm, and for a period of about 10 seconds Etch step 11 may comprise a sixth Break Through Etch (BT6) using $CF_4$ as etchant gas. BT6 may be performed at a pressure of about 4 mT, source power of from about 100 W to about 500 W, preferably about 300 W, bias power of from about 30 W to about 150 W, preferably about 45 W, $CF_4$ flowrate of from about 30 sccm to about 150 sccm, preferably about 50 sccm, and for a period of about 13 seconds.

Figure 8:
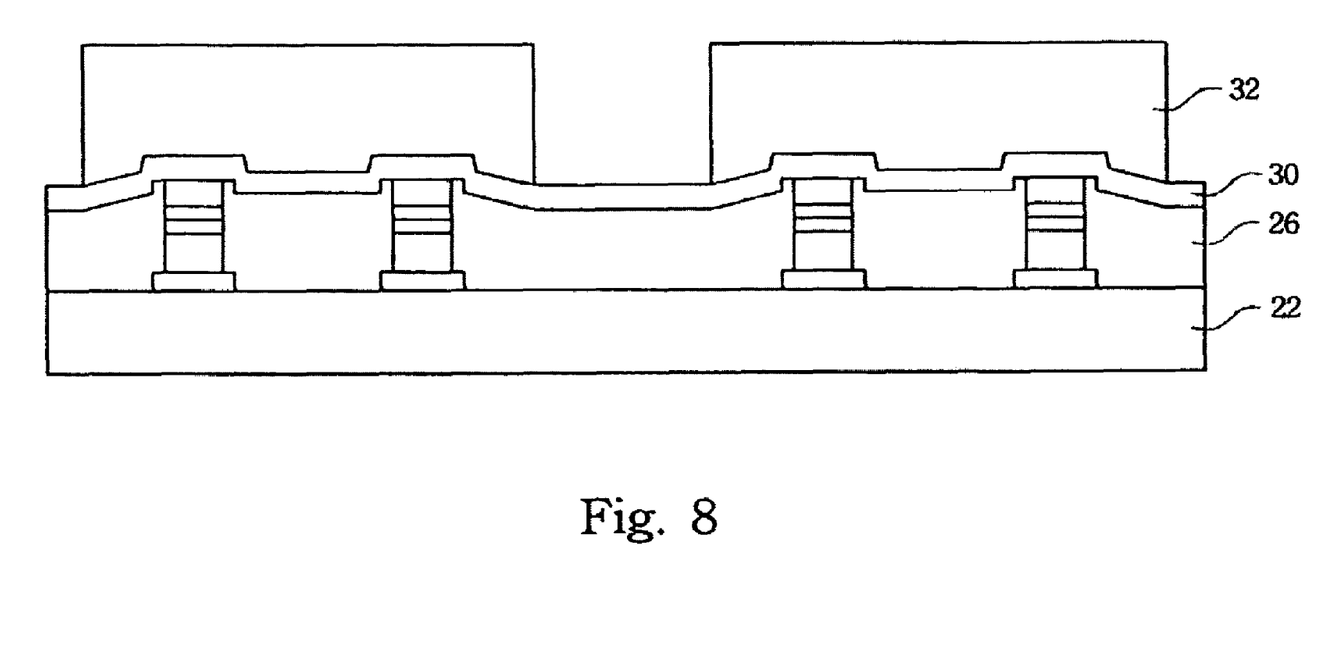
FIG. 8 shows the structure of FIG. 7 subsequent to the application of a mask layer.
Figure 9:
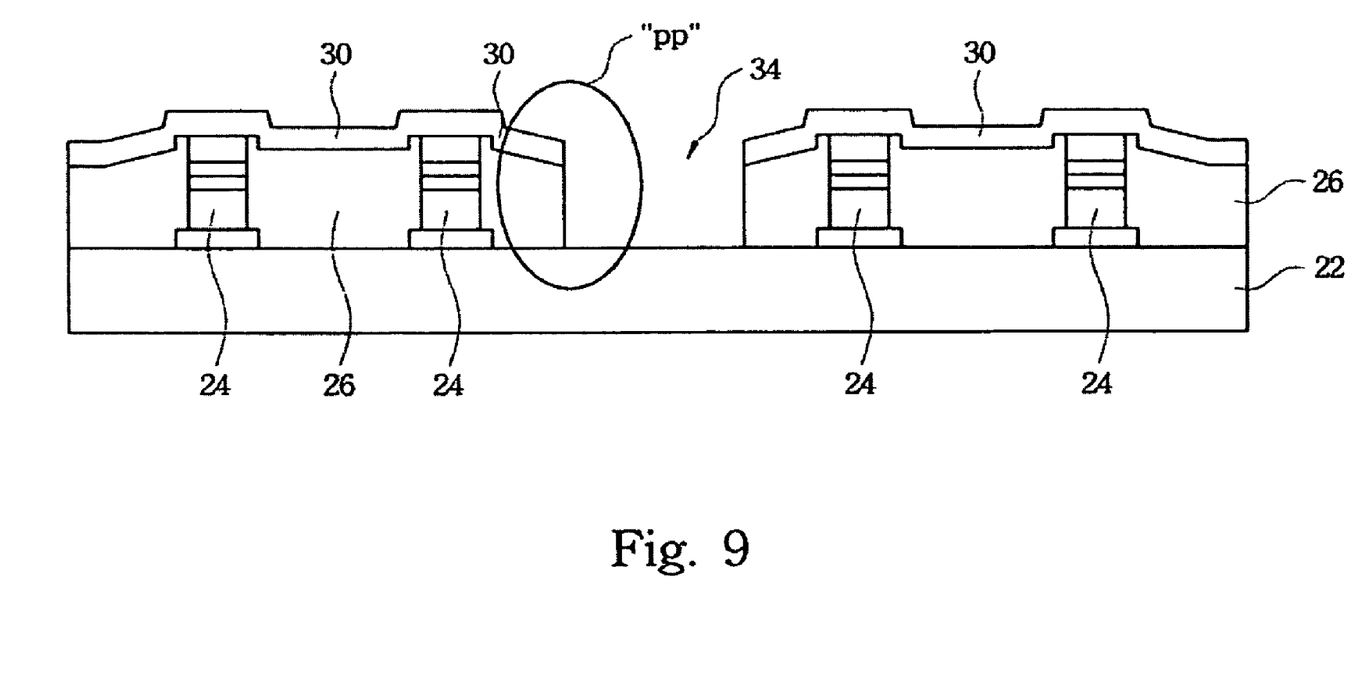
FIG. 9 shows the structure of FIG. 8 subsequent to etching of the polysilicon layer and removal of the mask layer.

The results of ladder etch steps 1-11 can be seen in FIG. 7, in which the BARC layer 28 and a portion of the polysilicon layer 26 (to a point just below the top of the word lines 24) are removed. The ladder etch can be seen to create a smooth curved profile. Referring to FIG. 8, a thin dielectric layer 30 is then applied over the etched polysilicon layer 26. In one embodiment, the dielectric layer 30 comprises SiON deposited to a thickness of about 660 Å. Acceptable alternative dielectric materials for use as layer 30 may be SiN, CVD amorphous carbon, or the like. A masking layer 32 is then applied over the dielectric layer 30. The polysilicon layer 26 is then etched using a dry etching technique (e.g., hardmask etch, in situ $O_2$ ashing, then poly etching) to provide a trench 34 between adjacent word lines 24 (FIG. 9). As can be seen, the dielectric (SiON) layer 30 and polysilicon layer 26 adjacent to the trench 34 (identified as area "PP") are free from abnormalities.

In a further step, a layer of SiN (i.e., an SiN cap layer) may be applied to protect the peripheral logic elements on the chip. In one embodiment, this SiN cap layer may be about 1600 Å thick. If this step is performed, then the SiN layer would be applied after the step of depositing the polysilicon layer 26. This SiN layer would be removed after the ladder etching steps are performed.

ADVANTAGES OF THE INVENTION

The inventive process is simple and thus can be implemented at low cost. Further, a word line polysilicon layer having a curved surface is easy to be identified. That is, the curved surface created by the inventive technique is distinguishable from the flat-plate type profile that typically results from CMP processes. Additionally, the inventive process solves the problems associated with abnormal poly profiles in embedded flash memory cells.

While the foregoing invention has been described with reference to the above embodiments, various modifications and changes can be made without departing from the spirit of the invention. Accordingly, all such modifications and changes are considered to be within the scope and range of equivalents of the appended claims.

The invention claimed is:

1. A method of word line etching, comprising the steps of:
   (a) patterning a word line;
   (b) depositing a layer of polysilicon over said word line;
   (c) depositing a layer of bottom antireflective coating (BARC) material over said layer of polysilicon;
   (d) etching said BARC layer and said polysilicon layer using a ladder etch, said ladder etch removing the BARC layer and a portion of said polysilicon layer;
   (f) depositing a dielectric layer on a top surface of the etched polysilicon layer; and
   (g) applying a mask layer over said dielectric layer and etching at least one feature into said polysilicon layer;
   wherein said ladder etch comprises a series of breakthrough etch steps and soft landing etch steps.

2. The method of claim 1, wherein the ladder etch comprises a first etch cycle comprising a first breakthrough etch and a first soft landing etch, a second etch cycle comprising a second breakthrough etch and a second soft landing etch, and a third etch cycle comprising a third breakthrough etch and a third soft landing etch.

3. The method of claim 2, wherein each of the first, second and third breakthrough etches is performed using $CF_4$ gas, and the first, second and third soft landing etches is performed using a combination of HBr and $HeO_2$ gas.

4. The method of claim 2, further comprising a fourth etch cycle comprising a fourth breakthrough etch and a fourth soft landing etch, a fifth etch cycle comprising a fifth breakthrough etch and a fifth soft landing etch, and a sixth etch cycle comprising a sixth breakthrough etch.

5. The method of claim 4, wherein the top surface of the etched polysilicon layer has at least one curved section when viewed in cross-section.

6. The method of claim 1, wherein the step of depositing a layer of polysilicon results in the deposition of a polysilicon layer having a thickness of about 1,500 Angstrom (Å), and the step of depositing a BARC layer results in BARC layer having a thickness of about 1,600 Å.

7. The method of claim 6, further comprising the step of applying a protective dielectric layer over components located adjacent to said word lines.

8. An etching method, comprising the steps of:
   (a) providing a substrate with a plurality of word lines formed thereon;
   (b) depositing a layer of polysilicon over said plurality of word lines;
   (c) depositing a layer of organic spin-on material over said layer of polysilicon;
   (d) etching said organic spin-on material layer and said polysilicon layer using a ladder etch, said ladder etch removing the organic spin-on material layer and a thickness of said polysilicon layer so that said polysilicon layer does not overlie a top surface of each of the plurality of word lines;
   (f) depositing a dielectric layer on a top surface of the etched polysilicon layer; and
   (g) applying a mask layer over said dielectric layer and etching at least one feature into said polysilicon layer;
   wherein said ladder etch comprises a series of breakthrough etch steps and soft landing etch steps.

9. The method of claim 8, wherein the ladder etch comprises a first etch cycle comprising a first breakthrough etch and a first soft landing etch, a second etch cycle comprising a second breakthrough etch and a second soft landing etch, and a third etch cycle comprising a third breakthrough etch and a third soft landing etch.

10. The method of claim 9, wherein each of the first, second and third breakthrough etches is performed using $CF_4$ gas, and the first, second and third soft landing etches is performed using a combination of HBr and $HeO_2$ gas.

11. The method of claim 10, further comprising a fourth etch cycle comprising a fourth breakthrough etch and a fourth soft landing etch, a fifth etch cycle comprising a fifth breakthrough etch and a fifth soft landing etch, and a sixth etch cycle comprising a sixth breakthrough etch.

12. The method of claim 11, wherein the top surface of the etched polysilicon layer has at least one curved section when viewed in cross-section.

13. The method of claim 12, wherein the step of depositing a layer of polysilicon results in the deposition of a polysilicon layer having a thickness of about 1,500 Angstrom (Å), and the step of depositing an organic spin-on material layer comprises depositing a BARC layer having a thickness of about 1,600 Å.

14. The method of claim 13, further comprising the step of applying a protective dielectric layer over components located adjacent to said plurality of word lines.

15. An etching method, comprising the steps of:
(a) providing a flash cell on a substrate, the flash cell comprising a word line;
(b) depositing a layer of polysilicon over said word line;
(c) depositing a dielectric layer over an area peripheral to said flash cell;
(d) depositing an organic BARC coating over said polysilicon layer;
(e) performing a ladder etch of said BARC coating, said dielectric layer, and said polysilicon layer to a level below a top surface of said word line;
(f) depositing a dielectric layer over said etched polysilicon layer and said word line;
(g) applying a photo mask over said dielectric layer; and
(h) etching the dielectric layer and the polysilicon layer to create an etched feature;
wherein said ladder etch comprises a series of breakthrough etch steps and soft landing etch steps.

16. The method of claim 15, wherein the ladder etch comprises a first etch cycle comprising a first breakthrough etch and a first soft landing etch, a second etch cycle comprising a second breakthrough etch and a second soft landing etch, and a third etch cycle comprising a third breakthrough etch and a third soft landing etch.

17. The method of claim 16, wherein each of the first, second and third breakthrough etches is performed using $CF_4$ gas, and the first, second and third soft landing etches is performed using a combination of HBr and $HeO_2$ gas.

18. The method of claim 17, further comprising a fourth etch cycle comprising a fourth breakthrough etch and a fourth soft landing etch, a fifth etch cycle comprising a fifth breakthrough etch and a fifth soft landing etch, and a sixth etch cycle comprising a sixth breakthrough etch.

19. The method of claim 18, wherein the top surface of the etched polysilicon layer has at least one curved section when viewed in cross-section.

20. The method of claim 19, wherein the step of depositing a layer of polysilicon results in the deposition of a polysilicon layer having a thickness of about 1,500 Angstrom (Å), and the step of depositing a BARC layer results in BARC layer having a thickness of about 1,600 Å.

* * * * *